United States Patent [19]
Kerschbaumer

[11] Patent Number: 5,269,894
[45] Date of Patent: Dec. 14, 1993

[54] METHOD OF MOUNTING A TARGET PLATE TO BE COOLED INTO A VACUUM PROCESS CHAMBER, AN ARRANGEMENT OF A TARGET PLATE, A TARGET PLATE AND A VACUUM CHAMBER

[75] Inventor: Jörg Kerschbaumer, Feldkirch-Tosters, Austria

[73] Assignee: Balzers Aktiengesellschaft, Liechtenstein, Liechtenstein

[21] Appl. No.: 878,049

[22] Filed: May 4, 1992

[30] Foreign Application Priority Data

May 8, 1991 [CH] Switzerland ............... 1386/91

[51] Int. Cl.⁵ .............................................. C23C 14/34
[52] U.S. Cl. ..................... 204/192.12; 204/298.09; 204/298.12
[58] Field of Search ............ 204/298.09, 298.12, 204/192.12

[56] References Cited

U.S. PATENT DOCUMENTS 5,032,246 7/1991 Blazic et al. ............... 204/298.12
5,071,535 12/1991 Hartig et al. ............ 204/298.12 X

FOREIGN PATENT DOCUMENTS 0401622 12/1990 European Pat. Off. ....... 204/298.12

*Primary Examiner*—Nam Nguyen
*Attorney, Agent, or Firm*—Notaro & Michalos

[57] ABSTRACT

A method of mounting a vacuum process arrangement comprises providing a cooling plate having at least one channel and at least one bayonet locking means. A heat conducting membrane is then placed over each channel of the cooling plate. A target plate having at least one bayonet locking means is also provided. The locking plate is then locked to the cooling plate over the channels by engaging the bayonet locking means of the target plate with the bayonet locking means of the cooling plate by limited relative axial and rotational movement between the plates. Finally, a cooling medium is introduced in the channels of the cooling plate and pressurized.

9 Claims, 2 Drawing Sheets

METHOD OF MOUNTING A TARGET PLATE TO BE COOLED INTO A VACUUM PROCESS CHAMBER, AN ARRANGEMENT OF A TARGET PLATE, A TARGET PLATE AND A VACUUM CHAMBER

FIELD AND BACKGROUND OF THE INVENTION

The present invention relates to a method of mounting a target plate to be cooled into a vacuum process chamber; an arrangement of a target plate to be cooled, and a vacuum process chamber, wherein said target plate is to be installed, the present invention also relates to a target plate for a vacuum coating process and a vacuum chamber for vacuum-process-coating workpieces by target sputtering and target evaporation.

It is well-known, that various vacuum processes use target plates, which are consumed during the process. In reactive or non-reactive coating processes, the target surface is sputtered by applying a DC and/or an AC glow discharge, simultaneously, along a relatively large surface area, and material particles are deposited on workpieces, either directly or after a chemical reaction in which a reactive gas is introduced into the vacuum chamber.

Thus the target is often operated within a magnetron arrangement for so-called high rate sputtering, by which magnetronically the density of ions adjacent to the target surface is increased.

In other coating processes, the target is evaporated by an electric arc or by the action of an electron beam.

In each of these cases, the target is highly loaded thermically by the sputtering or evaporation process, either through ion bombardment, electron bombardment or by the electric arc drawn onto the target surface.

All target plates should be replaceable in a simple manner and without disassembling the parts of the vacuum chamber. It must often be ensured that no material of the mounting members is exposed to the process chamber, which is different than the material sputtered or evaporated, because such additional material could ruin the delicate coating processes.

In order to remove the heat resulting from these processes, the target plates are usually mounted on a cooling plate arrangement.

The largest amount of heat can be removed from such target plates when these plates are in direct contact with a cooling medium in liquid or gaseous form. Such a cooling approach is hardly used due to the sealing considerations with respect to the vacuum process chamber.

Thus, it is known, e.g. from the European specification EP-A-0 334 347, or from the article "Cathode Cooling Apparatus for a Planar Magnetron Sputtering System", M. R. Lake and G. L. Harding, J.Vac.Sci.-Technol. A 2(3), July/September 1984, American Vacuum Society, p. 1391 ff., or from the Sovjet Patent Specification No. 823 459, the EP-A-0 393 344, to separate a conduit system for the cooling medium from the inside surface of the target plate by a thin membrane-like or foil-like heat conducting partition wall, whereby at the one side, the vacuum technical sealing problems are resolved with respect to a direct contact cooling. On the other side, due to the pressure of the cooling medium onto the membrane-like partition wall and therefrom onto the inside surface of the target plate, there is realized a very accurate heat transition from the target plate to the cooling medium. Thereby, the target plate withstands the forces which are generated by the pressure of the cooling medium. If the mechanical loading capability of the target plate is too low, for instance due to its dimensioning and/or to the characteristics of the target material, it is common to provide a target plate made from a plate of target material and from a target support plate, in which the plates are bonded together. Thus, the supporting plate takes up the major part of the mechanical loading of the target plate.

Where small target plates are used, the small target plates are mounted at their periphery, e.g. by means of a clamping frame. Larger target plates are commonly clamped in their central area.

The mounting of the target plate is usually performed either from the side pointing towards the area within the process chamber wherein the process occurs, i.e. from the front side, or from the side pointing towards the chamber wall of the process chamber, i.e. the cooling plate, from the rear. A mounting of the target plate from the front (according to the Swiss specification no. CH-A-644 303) has the advantage that the target plate may easily be removed and mounted without the need of having to disassemble the cooling plate. However, a disadvantage is that the material of the mounting means, such as as the material of screw bolts, and differs from the material of the target plate, and is exposed to the process area within the process chamber, which disables due to sputtering or evaporating the entire target surface. Thus, the areas of this surface adjacent to other material mounting means may not be exploited without ruining the coating process by the material of the mounting means. This has an impact with regard to the distribution of the coating thickness of the layer resulting from sputtering. This limits the exploitation of the target plate which is often made of expensive material.

A co-sputtering of such mounting means or members arranged at the front side of the target plate, i.e. the side exposed to the sputtering process or to the evaporation process, may never be completely excluded. Therefore, such a target plate mount is avoided for delicate coating processes which must meet the highest demands.

A target mount with screw bolts introduced from the rear side of the target plate is taught by specification no. CH-A-669 242 which has the advantage that the target plate may be sputtered or evaporated along its entire front surface, but has the disadvantage that when replacing the target plate the cooling plate must be disassembled in order to provide access to the mounting bolts.

It is taught by U.S. Pat. No. 5,009,765 to bond or weld a target plate onto a supporting cylinder. The supporting cylinder comprises radially projecting lugs at a radially projecting flange with which the supporting cylinder is mounted in recesses provided at the wall of the vacuum process chamber. The supporting cylinder with the target plate welded thereto defines an interior chamber which is substantially higher than the thickness of the target plate. This volume is relatively large so as to allow it to be filled with an relatively large volume of a cooling liquid.

However approach has disadvantages in that, together with the target plate, a relatively complicated additional part, namely the supporting cylinder, must be exchanged. This supporting cylinder is in general not made of the same material as the target plate due to the machining requirements and/or due to cost considerations. In the case where the target plate and the supporting cylinder are made of different materials, the material of the supporting cylinder being co-sputtered will ruin the coating process.

Also, the mount of the target plate, namely the welding seam, is exposed to high thermical and mechanical (cooling medium pressure/vacuum pressure) loadings, which present, under consideration of different pairs of materials for the target plate and the supporting cylinder, additional problems.

According to EP-A-0 393 344, only the target plate itself is exchanged, but holding frames are provided which are exposed to the process and are thus co-sputtered and against which the pressure of a cooling medium acts via a sealing membrane. The holding frames are generally not made of the same material as the target plate, due to the costs which would arise if these frames were machined from a highly expensive target material or due to machining problems which would arise and which would cause additional costs if such frames would have to be machined from the target material.

SUMMARY OF THE INVENTION

It is, therefore, a general object of the present invention to provide a method of mounting a target plate, and an arrangement of a target plate to be cooled, and a vacuum process chamber wherein said target plate is to be installed. Another object of the present invention is to provide a target plate and a vacuum chamber, in which no mounting members are exposed to the process area at the front side of the target plate and which allow a rapid exchange of the target plate without necessitating the exchange of complicated additional parts. The exchange is performed from the front side of the target plate, namely from the inside of the process chamber.

A further object of the present invention is to provide a method of mounting a target plate to be cooled into a vacuum process chamber having a chamber wall, in which the method comprises the steps of providing at the target plate first parts of a bayonet lock; providing at the wall of said chamber second parts of the bayonet lock and moving the target plate with respect to the wall so as to mutually engage the first parts and the second parts of the bayonet lock in order to lock the bayonet, further introducing a cooling medium beneath the target plate and mutually biasing the first and second parts of the bayonet lock by pressurizing the cooling medium.

It is a further object of the present invention to provide an arrangement of a target plate to be cooled and a vacuum process chamber wherein the target plate is to be installed in which the arrangement comprises the first parts of a bayonet lock at the target plate and the second parts of the bayonet lock at the chamber wall facing the inside of the chamber, wherein the second parts define an area of the chamber wall adjacent to the parts of the target plate which come to rest with the bayonet lock when the first and second parts are installed, and to provided a cooling chamber arrangement a for cooling medium at the area of the chamber wall which comprises a membrane-like outer wall, in which the membrane-like outer wall is pressed towards the target plate by pressurizing the cooling medium within the cooling chamber as said target plate is locked by said bayonet lock so as to bias said locked bayonet lock.

Still a further object of the present invention is to provide a target plate for a vacuum coating process which comprises parts of a bayonet lock. Another object is to provide a vacuum chamber for vacuum-process-coating workpieces by either target sputtering or target evaporation which comprises mounting means for the target plate having parts of a bayonet lock defining an area for introducing and locking the target plate and which further comprises a cooling chamber arrangement in said area with a membrane-like outside wall adjacent to is so that part of said target plate comes to reside once mounted.

By providing the bayonet lock with parts at the target plate and parts at the vacuum chamber, the present invention achieves the following:

First, the target plate itself may be exchanged by manipulating the plate from its front side, i.e. from the side of the area within the chamber where the process occurs;

Second, beside the of parts of the chamber wall which are exposed to the process, no additional fixating members have to be exposed to the process;

Third, the double function of the cooling medium for cooling the target plate and for biasing the target plate lock is maintained, and Fourth, the target plate is mounted in a clearly defined position, i.e. defined by the abutments of the bayonet lock.

The above-mentioned method comprises further rotating the target plate with respect to the wall in order to instal or release the bayonet lock, so that the mounting and disassembling manipulations become especially simple.

Depending the bayonet lock makes it, the thickness of the target plate and the material of the target plate, being, as was mentioned, extensively and especially thermically loaded, to fixate the target plate in its central area and/or along its peripheral area against the pressure of the cooling medium, because the method above comprises the step of providing the first parts of the bayonet lock at least in either the central area of the target plate or a peripheral area of the target plate.

Thus, the locking of the target plate can be realized in such a way that only tolerable mechanical stress occurs within the target plate as the plate expands due to thermical loading.

Preferably, a twist-bayonet lock is provided for the plate, such that the target plate is not abutting the parts of the chamber wall which would prevent its radial expansion.

Patent Abstracts of Japan, vol. 12, no. 56 (C-477) (2903), Feb. 19, 1988, and JP, A, 62 199 769 (Hitachi), Sep. 3, 1987, teach that, during an evaporation process, workpieces are carried with a carrier from a pre-vacuum chamber through a load lock valve into the evaporation area where the carrier is linearly moved into contact with lateral holding members. The carrier is biased to said holding members by the action of a cooling plate which is driven towards the reverse side of the carrier by means of a pressurized cooling medium.

The selection of the material of the carrier and of the material for the holding members is not critical in such an evaporation process because it is different from a sputtered or evaporated target plate process in that is neither evaporated nor sputtered. The lateral holding members disclosed by the prior art above act similar to drawing guidances and do not form a real bayonet lock which necessitates a relative movement of two parts to be locked in two directions, e.g., in two directions laying in a plane according to x and y, or a twistable bayonet having an axial linear introducing movement and then a rotational movement around the axis which is, known from electronic cable connectors.

BRIEF DESCRIPTION OF THE DRAWINGS

Further advantages and preferred embodiments of the present invention will become evident in connection with the following description of such preferred embodiments. Thus, the invention will be better understood and objects other than those set forth above will become apparent when consideration is given to the following detailed description thereof.

Such description makes reference to the annexed drawings, wherein.

DESCRIPTION OF THE PREFERRED EMBODIMENTS

Figure 1:
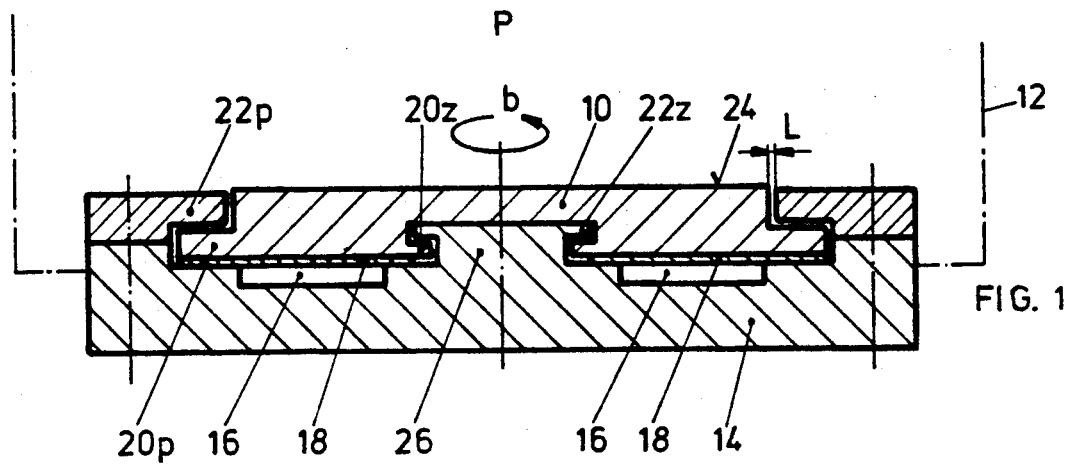
FIG. 1 illustrates a schematic cross-sectional view of a mounting arrangement for a target plate structured in accordance with the present invention, wherein the target plate is in an unbiased state.

FIG. 1 illustrates schematically a target plate 10 mounted in accordance with the invention. A vacuum chamber wall 12, schematically shown by dash-dotted lines, comprises a cooling plate 14 having channels 16 for a cooling medium, liquid or gaseous, commonly water. The channels 16 in the cooling plate 14 are closed in a sealed manner against the process chamber or area P by highly heat conducting membranes 18, preferably made of metal foils.

Both the target plate 10 and the cooling plate 14 each comprise bayonet lock parts 20p, 20z, 22p and 22z at the center area and at the peripheral area. The target plate 10 has bayonet lock parts 20p and 22z projecting radially and the cooling plate 14 has corresponding bayonet lock parts 22p and 22z, respectively. The bayonet locking part 22p is in fact part of the chamber wall 12. The bayonet lock parts 20, 22 located at the cooling plate and at the target plate, respectively, and in accordance with FIG. 1 form two coaxially arranged bayonet locks, according to the indices p and z, which locks as indicated by the arrow b. The bayonet lock parts 20, 22 are opened and closed, respectively, by a pivoting or rotating of the target plate 10 substantially parallel to a top surface 24 of the target plate 10 faces the process chamber P, relative to the process chamber wall 12. Attention is drawn to a radial clearance L between target plate 10 and the target plate receiving parts of the chamber wall 12, which enables a substantially free thermal radial expansion of the target plate 10.

Figure 5:
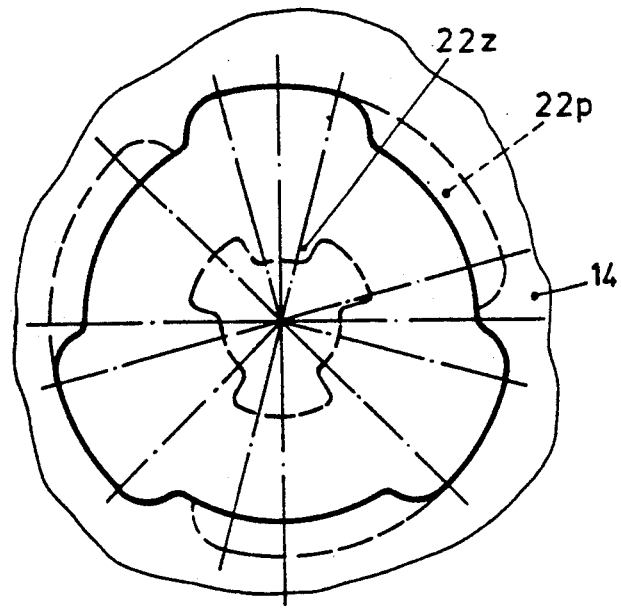
FIG. 5 is a top view of the parts of a bayonet lock at a vacuum chamber wall.
Figure 6:
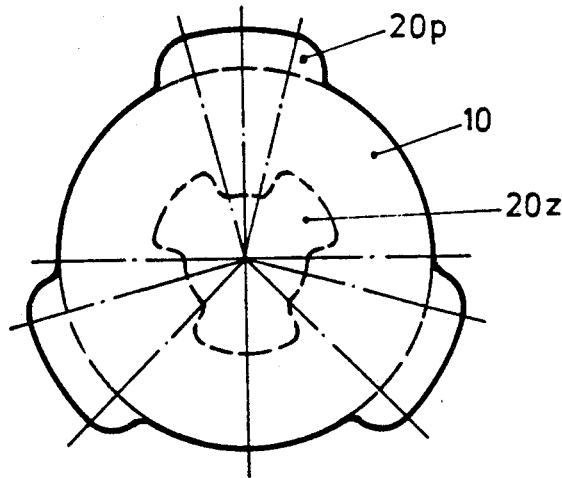
FIG. 6 is a top view of the parts of a bayonet lock at the target plate.
Figure 7:
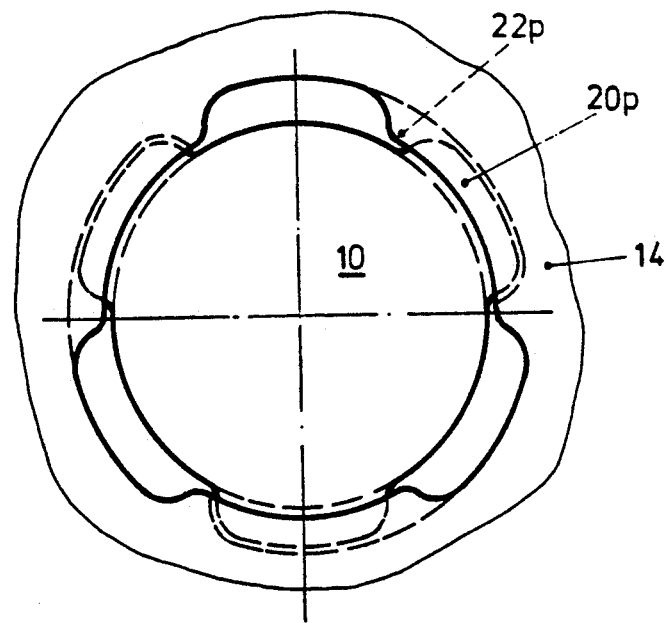
FIG. 7 is a view similar to FIGS. 5 and 6 illustrating a mounted target plate having a bayonet lock as a peripheral lock.

A top view of an embodiment of the bayonet lock parts is illustrated in FIGS. 5 to 7, in which primarily the layout of the peripheral lock is illustrated, by broken lines in FIGS. 5 and 6. Additionally a central lock is formed, corresponding to the indices z, formed by 20z and 22z.

According to the present invention, particularly FIG. 1, the cooling medium in the channels 16 is not yet pressurized. In this state, an axial and a radial clearance is provided between the target plate 10 and the cooling plate 14, such that the target plate 10, after having been placed onto the cooling plate 14, can be easily slid into a bayonet lock 20, 22 by rotational movement. The plate 10 is locked to the plate 14 by limited relative axial and rotational movement between the plates. The target plate 10 is thereby positioned at the peripheral area centered relative to the cooling plate 14 by a central bayonet stub at the cooling plate 14, illustrated at 26 in spite of the radial clearance L.

Figure 2:
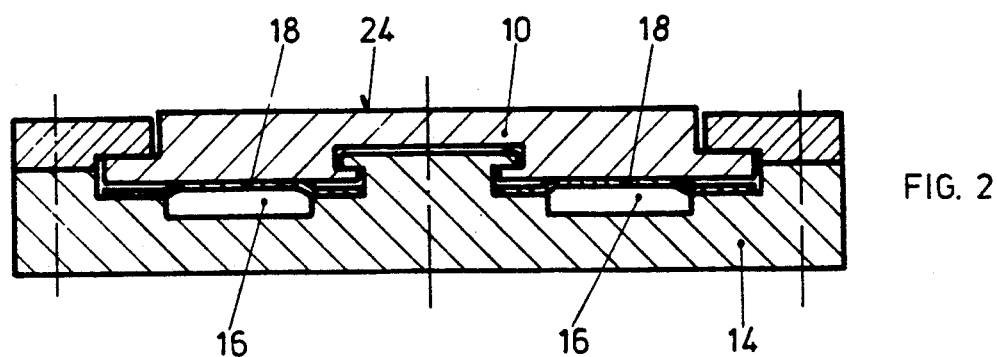
FIG. 2 illustrates the arrangement of FIG. 1 with the target plate in a biased state.

In FIG. 2, the cooling medium in the channels 16 of the arrangement is pressurized, and the heat conducting membranes 18, preferably formed by metal foils, are biased against the target plate 10 and which biases the plate 10 axially within the extent of the axial clearance. The bayonet lock 20, 22 is itself braced or biased at the same time and provides an excellent heat transfer from the target plate 10 via the metal foil 18 onto the cooling medium in the channels 16. In spite of the axial biasing of the bayonet lock 20, 22 the radial clearance L of the target plate 10 relative to the cooling plate 14 is maintained, such that the target plate 10 can freely expand thermally in a radial direction. The axial expansion of the plate 10 acts against the pressure of the medium in the channels 16. By means of this, thermically caused stresses in the target plate 10 and, accordingly, deformations of the surface 24 of the target plate 10 are significantly reduced.

This leads basically to the effect that the target plate 10 can be exploited better and that, as illustrated in FIGS. 1 and 2, it becomes possible to use target material plates without stabilizing backing plates such that the target plates become less expensive. It further becomes possible to use larger target plates.

It will be shown below that it is possible to apply only central or only peripheral bayonet locks, instead of combined central and peripheral bayonet locks only central or only peripheral bayonet depending on the dimensions, especially the ratio of target plate extension to its thickness, and on the material of the target plate—brittle or rather ductile—and on the operating temperature of the target plate 10.

Figure 3:
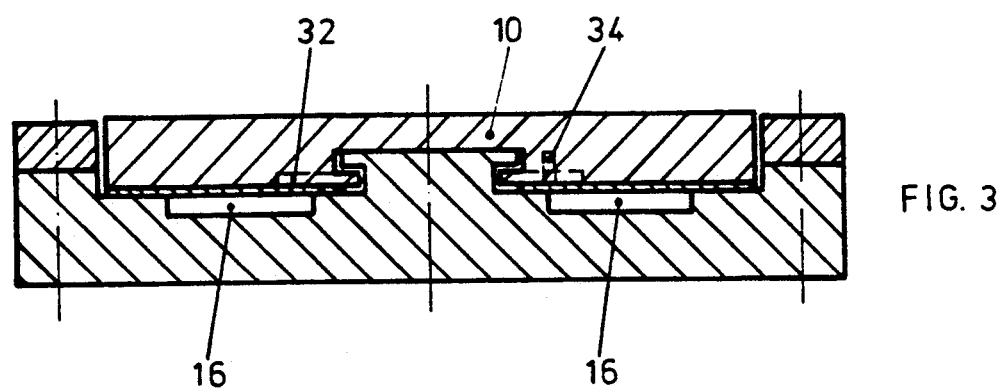
FIG. 3 is an illustration similar to FIG. 1, in which a bayonet lock is in the central area of the target plate.

FIG. 3 shows a target plate 10 analogous to the target plate of FIG. 1 whereby the medium in the channels 16 is not pressurized, and where the bayonet lock arrangement includes merely a central areal bayonet lock.

Figure 4:
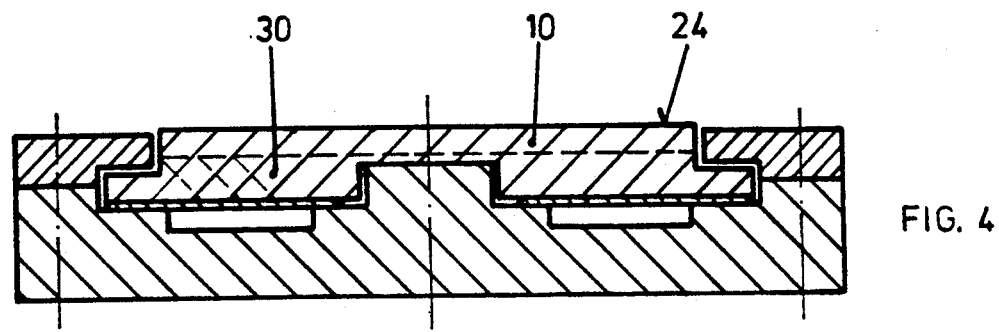
FIG. 4 is an illustration similar to FIG. 1, in which a bayonet lock is in the peripheral area of the target plate.

FIG. 4 illustrates an unpressurized lock arrangement with only a peripheral bayonet lock.

As illustrated in FIG. 4 the plate of target material with its surface 24 to be sputtered (or evaporated) can be mounted, depending on the target material, its dimensions and the operating temperature, onto a supporting stabilizing backing plate 30, for instance by a bonding. In this case, plate 10 and backing plate 30 commonly form the target plate according to the present invention.

Furthermore, it is also possible, as illustrated by the broken line in FIG. 3, to have the parts of the bayonet lock at the target plate 10 formed by separate structural members, e.g. a bayonet lock frame 32. After which after the target plate 10 has been consumed, the bayonet lock frame 32 will again be utilized for a subsequent target plate 10, and for this purpose is removable from the target plate 10, for instance by screws 34.

It has been recognized by the inventors that the proposed inventive technique is best suited for targets of aluminum or aluminum alloys.

While there have been shown and described preferred embodiments of the invention, it is to be distincly understood that the invention is not limited thereto, but may be otherwise be variously embodied and practiced within the scope of the following claims.

I claim:

1. An arrangement for a vacuum process comprising:
    a cooling plate having at least one channel thereon for containing a cooling medium;
    a heat conducting membrane placed over each channel;
    a target plate engageable with the cooling plate over the heat conducting membranes for operating in the vacuum process; and
    bayonet locking means for locking the target plate to the cooling plate by limited relative axial and rotational movement between the plates.

2. The arrangement according to claim 1, wherein the bayonet locking means comprises at least one central bayonet locking part on the cooling plate at a centrally located area of the cooling plate and at least one central bayonet locking part on the target plate at a centrally located area of the target plate, the central bayonet locking part of the target plate being engageable with the central bayonet locking part of the cooling plate for locking the target plate to the cooling plate by limited relative axial and rotational movement between the plates.

3. The arrangement according to claim 2, wherein the bayonet locking means further comprises at least one peripheral bayonet locking part at a peripheral area of the cooling plate and at least one peripheral bayonet locking part at a peripheral area of the target plate, the peripheral bayonet locking part of the target plate being engageable with the peripheral bayonet locking part of the cooling plate for locking the target plate to the cooling plate by limited relative axial and rotational movement between the plates.

4. The arrangement according to claim 1, wherein the bayonet locking means further comprises at least one peripheral bayonet locking part at a peripheral area of the cooling plate and at least one peripheral bayonet locking part at a peripheral area of the target plate, the peripheral bayonet locking part of the target plate being engageable with the peripheral bayonet locking part of the cooling plate for locking the target plate to the cooling plate by limited relative axial and rotational movement between the plates.

5. The arrangement according to claim 1, including a stabilizing plate mounted to the target plate.

6. A method of mounting a vacuum process arrangement, the method comprising:
    providing a cooling plate having at least one channel thereon and having at least one bayonet locking means;
    placing a heat conducting membrane over each channel of the cooling plate;
    providing a target having at least one bayonet locking means;
    locking the target plate to the cooling plate over the channels by engaging the bayonet locking means of the target plate with the bayonet locking means of the cooling plate by limited relative axial and rotational movement between the plates;
    introducing a cooling medium in the channels of the cooling plate; and
    pressurizing the cooling medium.

7. The method according to claim 6, wherein the target plate is locked to the cooling plate at a central area of the target plate and the cooling plate.

8. The method according to claim 7, wherein the target plate is locked to the cooling plate at a peripheral area of the target plate and the cooling plate.

9. The method according to claim 6, wherein the target plate is locked to the cooling plate at a peripheral area of the target plate and the cooling plate.

* * * * *